(12) United States Patent
Sun et al.

(10) Patent No.: US 11,062,654 B2
(45) Date of Patent: Jul. 13, 2021

(54) SHIFT REGISTER UNIT, GATE DRIVING CIRCUIT, DISPLAY DEVICE AND DRIVING METHOD

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Shicheng Sun, Beijing (CN); Shuang Hu, Beijing (CN); Jianfei Tian, Beijing (CN); Peirong Huo, Beijing (CN); Zhiqiang Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 16/386,406

(22) Filed: Apr. 17, 2019

(65) Prior Publication Data
US 2020/0035163 A1    Jan. 30, 2020

(30) Foreign Application Priority Data

Jul. 26, 2018    (CN) .......................... 201810835445.X (51) Int. Cl.
*G11C 19/00*    (2006.01)
*G09G 3/3258*    (2016.01)
(Continued)

(52) U.S. Cl.
CPC ............. *G09G 3/3258* (2013.01); *G06F 1/06* (2013.01); *G09G 3/20* (2013.01); *G09G 3/3266* (2013.01); *G09G 3/3677* (2013.01); *G11C 19/28* (2013.01); *G11C 19/287* (2013.01); *G09G 2310/0286* (2013.01); *G09G 2310/0289* (2013.01); *G09G 2310/08* (2013.01)

(58) Field of Classification Search
None
See application file for complete search history.

(56) References Cited

U.S. PATENT DOCUMENTS

2014/0118237 A1* 5/2014 Wang ................ G11C 19/28
345/100
2016/0125955 A1* 5/2016 Pang ................. G11C 19/287
377/64
(Continued)

*Primary Examiner* — Tuan T Lam
(74) *Attorney, Agent, or Firm* — Leason Ellis LLP (57) ABSTRACT

A shift register unit, a gate driving circuit, a display device and a driving method are provided. The shift register unit includes an input circuit, an output circuit, a first reset circuit, a second reset circuit and a common reset circuit. The input circuit is configured to control a level of a first node in response to an input signal; the output circuit includes an output terminal and is configured to output an output voltage signal to the output terminal under control of the level of the first node; the common reset circuit includes a reset control terminal and is configured to reset the first node when a reset turn-on signal is input to the reset control terminal; and the first reset circuit is configured to provide the reset turn-on signal to the reset control terminal in response to a first reset signal.

18 Claims, 7 Drawing Sheets

(51) Int. Cl.
    *G06F 1/06*          (2006.01)
    *G09G 3/3266*     (2016.01)
    *G09G 3/36*         (2006.01)
    *G11C 19/28*      (2006.01)
    *G09G 3/20*         (2006.01)

(56) References Cited

U.S. PATENT DOCUMENTS

| | | | |
|---|---|---|---|
| 2019/0206294 A1* | 7/2019 | Tian | G09G 3/20 |
| 2019/0228691 A1* | 7/2019 | Bi | G01R 31/2846 |
| 2019/0228712 A1* | 7/2019 | Li | G09G 3/20 |
| 2019/0287446 A1* | 9/2019 | Liao | G09G 3/20 |
| 2019/0385688 A1* | 12/2019 | Fu | G11C 19/28 |

* cited by examiner

SHIFT REGISTER UNIT, GATE DRIVING CIRCUIT, DISPLAY DEVICE AND DRIVING METHOD

This present application claims the priority to Chinese patent application No. 201810835445.X, filed on Jul. 26, 2018, the entire disclosure of which is incorporated herein by reference as part of the present application.

TECHNICAL FIELD

Embodiments of the present disclosure relate to a shift register unit, a gate driving circuit, a display device and a driving method.

BACKGROUND

In the field of display technology, for example, a pixel array of a liquid crystal display generally includes rows of gate lines and columns of data lines that intersect with each other. Driving of the gate lines can be implemented by an integrated driving circuit amounted on an array substrate. In recent years, with the continuous improvement of an amorphous silicon thin film process, a gate driving circuit can also be directly fabricated on a thin film transistor array substrate to form a GOA (Gate driver On Array) to drive gate lines.

For example, the GOA formed of a plurality of cascaded shift register units can be used to provide switching voltage signals for the rows of gate lines of a pixel array, thereby controlling the rows of gate lines to be turned on sequentially. Data signals are provided by data lines to the pixel units of a corresponding row in the pixel array in each period, thereby forming gray voltages required for displaying each grayscale of an image, and displaying each frame of the image.

SUMMARY

At least one embodiment of the present disclosure provides a shift register unit including an input circuit, an output circuit, a first reset circuit, a second reset circuit, and a common reset circuit. The input circuit is configured to control a level of a first node in response to an input signal; the output circuit includes an output terminal and is configured to output an output voltage signal to the output terminal under control of the level of the first node; the common reset circuit includes a reset control terminal and is configured to reset the first node when a reset turn-on signal is input to the reset control terminal; the first reset circuit is configured to provide the reset turn-on signal to the reset control terminal in response to a first reset signal; the second reset circuit is configured to provide the reset turn-on signal to the reset control terminal in response to a second reset signal; and the input circuit is respectively coupled to the output circuit and the common reset circuit, the output circuit is coupled to the common reset circuit, the common reset circuit is respectively coupled to the first reset circuit and the second reset circuit, and the first reset circuit is coupled to the second reset circuit.

For example, in a shift register unit provided by an embodiment of the present disclosure, the input circuit includes an input terminal and a first voltage terminal, the input terminal is configured to receive the input signal, the first voltage terminal is configured to receive a first voltage, the input circuit is coupled to the first node, and the input circuit controls the level of the first node by using the first voltage when the input circuit is turned on; the output circuit further includes a first clock signal terminal, the first clock signal terminal is configured to receive a first clock signal, the output circuit is coupled to the first node, and the output circuit outputs the first clock signal as the output voltage signal to the output terminal when the output circuit is turned on.

For example, in a shift register unit provided by an embodiment of the present disclosure, the common reset circuit is coupled to the first node, the first reset circuit and the second reset circuit; the first reset circuit includes a first reset signal terminal and a cascade terminal, the first reset signal terminal is configured to receive the first reset signal, the cascade terminal is configured to receive the reset turn-on signal, the first reset circuit is coupled to the reset control terminal, and the first reset circuit provides the reset turn-on signal to the reset control terminal when the first reset circuit is turned on; the second reset circuit includes a second reset signal terminal and a frame signal terminal, the second reset signal terminal is configured to receive the second reset signal, the frame signal terminal is configured to receive the reset turn-on signal, the second reset circuit is coupled to the reset control terminal, and the second reset circuit provides the reset turn-on signal to the reset control terminal when the second reset circuit is turned on.

For example, in a shift register unit provided by an embodiment of the present disclosure, the input circuit includes a first transistor; a gate electrode of the first transistor is coupled to the input terminal, a first electrode of the first transistor is coupled to the first voltage terminal, and a second electrode of the first transistor is coupled to the first node.

For example, in a shift register unit provided by an embodiment of the present disclosure, the output circuit includes a second transistor and a first capacitor; a gate electrode of the second transistor is coupled to the first node, a first electrode of the second transistor is coupled to the first clock signal terminal, and a second electrode of the second transistor is coupled to the output terminal. A first electrode of the first capacitor is coupled to the first node, and a second electrode of the first capacitor is coupled to the output terminal.

For example, in a shift register unit provided by an embodiment of the present disclosure, the common reset circuit includes a third transistor and a second voltage terminal; the second voltage terminal is configured to receive a second voltage; a gate electrode of the third transistor is coupled to the reset control terminal, a first electrode of the third transistor is coupled to the first node, and a second electrode of the third transistor is coupled to the second voltage terminal.

For example, in a shift register unit provided by an embodiment of the present disclosure, the first reset circuit includes a fourth transistor; a gate electrode of the fourth transistor is coupled to the first reset signal terminal, a first electrode of the fourth transistor is coupled to the reset control terminal, and a second electrode of the fourth transistor is coupled to the cascade terminal.

For example, in a shift register unit provided by an embodiment of the present disclosure, the second reset circuit includes a fifth transistor; a gate electrode of the fifth transistor is coupled to the second reset signal terminal, a first electrode of the fifth transistor is coupled to the frame signal terminal, and a second electrode of the fifth transistor is coupled to the reset control terminal.

For example, a shift register unit provided by an embodiment of the present disclosure further includes a second node control circuit, a second node reset circuit and a third reset circuit; the second node control circuit is configured to control a level of a second node in response to a control signal; the second node reset circuit is configured to reset the second node under control of the level of the first node; and the third reset circuit is configured to reset the first node and the output terminal under control of the level of the second node.

For example, in a shift register unit provided by an embodiment of the present disclosure, the second node control circuit includes a sixth transistor; a gate electrode and a first electrode of the sixth transistor are configured to be coupled to a second clock signal terminal to receive a second clock signal, and a second electrode of the sixth transistor is coupled to the second node.

For example, in a shift register unit provided by an embodiment of the present disclosure, the second node control circuit further includes a second capacitor; a first electrode of the second capacitor is coupled to the second node, and a second electrode of the second capacitor is configured to be coupled to a third voltage terminal to receive a third voltage.

For example, in a shift register unit provided by an embodiment of the present disclosure, the second node reset circuit includes a seventh transistor; a gate electrode of the seventh transistor is coupled to the first node, a first electrode of the seventh transistor is coupled to the second node, and a second electrode of the seventh transistor is configured to be coupled to a third voltage terminal to receive a third voltage.

For example, in a shift register unit provided by an embodiment of the present disclosure, the second node reset circuit further includes an eighth transistor; a gate electrode of the eighth transistor is coupled to the output terminal, a first electrode of the eighth transistor is coupled to the second node, and a second electrode of the eighth transistor is configured to be coupled to the third voltage terminal to receive the third voltage.

For example, in a shift register unit provided by an embodiment of the present disclosure, the third reset circuit includes a ninth transistor and a tenth transistor; a gate electrode of the ninth transistor is coupled to the second node, a first electrode of the ninth transistor is coupled to the first node, and a second electrode of the ninth transistor is configured to be coupled to a third voltage terminal to receive a third voltage; and a gate electrode of the tenth transistor is coupled to the second node, a first electrode of the tenth transistor is coupled to the output terminal, and a second electrode of the tenth transistor is configured to be coupled to the third voltage terminal to receive the third voltage.

For example, in a shift register unit provided by an embodiment of the present disclosure, the first node is a pull-up node and the second node is a pull-down node.

At least one embodiment of the present disclosure further provides a gate driving circuit, and the gate driving circuit includes a plurality of cascaded shift register units each of which is provided by an embodiment of the present disclosure.

For example, a gate driving circuit provided by an embodiment of the present disclosure further includes a first scanning signal line, a second scanning signal line and a frame signal line; each stage of the shift register units is coupled to the first scanning signal line to receive the first reset signal; each stage of the shift register units is coupled to the second scanning signal line to receive the second reset signal; except a first-stage of the shift register units, all other stages of the shift register units are coupled to the frame signal line to receive the reset turn-on signal; and the first-stage of the shift register units is coupled to the frame signal line to receive the input signal and the reset turn-on signal.

For example, in a gate driving circuit provided by an embodiment of the present disclosure, except a last-stage of the shift register units, the first reset circuit of any one of the shift register units of other stages is coupled to the output circuit of a shift register unit of a next stage after the any one of the shift register units of other stages; except a first-stage of the shift register units, the input circuit of any one of the shift register units of other stages is coupled to the output circuit of a shift register unit of a preceding stage before the any one of the shift register units of other stages.

At least one embodiment of the present disclosure further provides a display device, and the display device includes the gate driving circuit which is provided by an embodiment of the present disclosure.

At least one embodiment of the present disclosure further provides a driving method of the shift register unit provided by an embodiment of the present disclosure, and the driving method includes a display period and a global reset period for one frame. In the display period, causing the input circuit to control the level of the first node in response to the input signal, causing the output circuit to output the output voltage signal to the output terminal under control of the level of the first node, causing the first reset circuit to provide the reset turn-on signal to the reset control terminal in response to the first reset signal, and causing the common reset circuit to reset the first node; and in the global reset period, causing the second reset circuit to provide the reset turn-on signal to the reset control terminal in response to the second reset signal, and causing the common reset circuit to reset the first node.

For example, in a driving method provided by an embodiment of the present disclosure, the first reset signal and the second reset signal are inverted phase signals to each other.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a display panel technology, in order to realize low cost and narrow bezel, a GOA (Gate driver On Array) technology can be adopted, that is, a gate driving circuit is integrated into the display panel by a thin film transistor manufacturing process, thereby achieving advantages such as narrow bezel, reducing assembly cost and the like. The display panel can be a liquid crystal display (LCD) panel or an organic light emitting diode (OLED) display panel.

Figure 1:
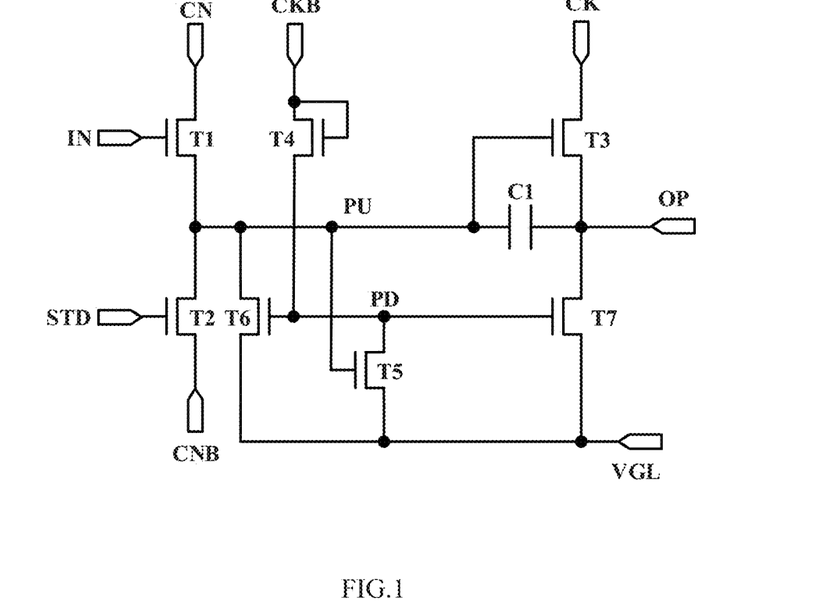
FIG. 1 is a circuit diagram of a shift register unit.

FIG. 1 shows a circuit diagram of a shift register unit, and a plurality of the shift register unit can be cascaded to form a gate driving circuit. As shown in FIG. 1, the shift register unit includes seven transistors (T1 to T7) and a first capacitor C1.

A gate electrode of a first transistor T1 is coupled to an input terminal IN, a first electrode of the first transistor T1 is coupled to a first voltage terminal CN, and a second electrode of the first transistor T1 is coupled to a pull-up node PU.

A gate electrode of a second transistor T2 is coupled to a cascade terminal STD, a first electrode of the second transistor T2 is coupled to the pull-up node PU, and a second electrode of the second transistor T2 is coupled to a second voltage terminal CNB.

A gate electrode of a third transistor T3 is coupled to the pull-up node PU, a first electrode of the third transistor T3 is coupled to a first clock signal terminal CK, and a second electrode of the third transistor T3 is coupled to an output terminal OP.

A gate electrode and a first electrode of a fourth transistor T4 are coupled to a second clock signal terminal CKB, and a second electrode of the fourth transistor T4 is coupled to a pull-down node PD.

A gate electrode of a fifth transistor T5 is coupled to the pull-up node PU, a first electrode of the fifth transistor T5 is coupled to the pull-down node PD, and a second electrode of the fifth transistor T5 is coupled to a third voltage terminal VGL (e.g., keeping receiving a direct current (DC) low-level signal).

A gate electrode of a sixth transistor T6 is coupled to the pull-down node PD, a first electrode of the sixth transistor T6 is coupled to the pull-up node PU, and a second electrode of the sixth transistor T6 is coupled to the third voltage terminal VGL.

A gate electrode of the seventh transistor T7 is coupled to the pull-down node PD, a first electrode of the seventh transistor T7 is coupled to the output terminal OP, and a second electrode of the seventh transistor T7 is coupled to the third voltage terminal VGL.

A first electrode of a first capacitor C1 is coupled to the pull-up node PU, and a second electrode of the first capacitor C1 is coupled to the output terminal OP.

For example, the above-mentioned transistors are all N-type transistors. The following description is also made by taking N-type transistors as an example, but embodiments of the present disclosure are not limited to this case, for example, at least some of these transistors can be replaced with a P-type transistor or P-type transistors.

The shift register unit as shown in FIG. 1 can realize a bidirectional scanning, for example, in a case where the first voltage terminal CN keeps receiving a DC high-level signal and the second voltage terminal CNB keeps receiving a DC low-level signal, a forward scanning can be realized. In a case where the first voltage terminal CN keeps receiving a DC low-level signal and the second voltage terminal CNB keeps receiving a DC high-level signal, an backward scanning can be realized. It should be noted that the forward scanning and the backward scanning in the embodiments of the present disclosure are relatively relative.

Figure 2A:
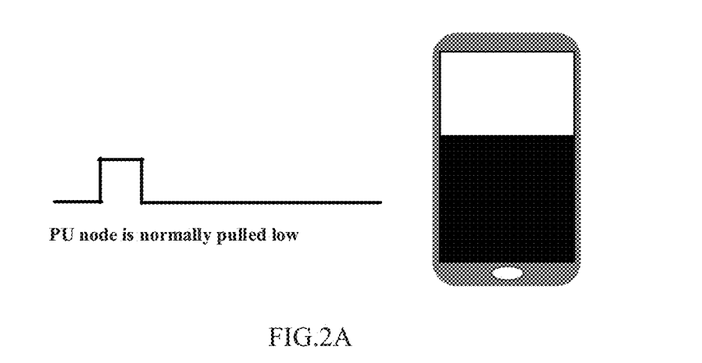
FIG. 2A is a schematic diagram of a pull-up node PU in a gate driving circuit in a case where the potential of the pull-up node PU is normally pulled low.
Figure 2B:
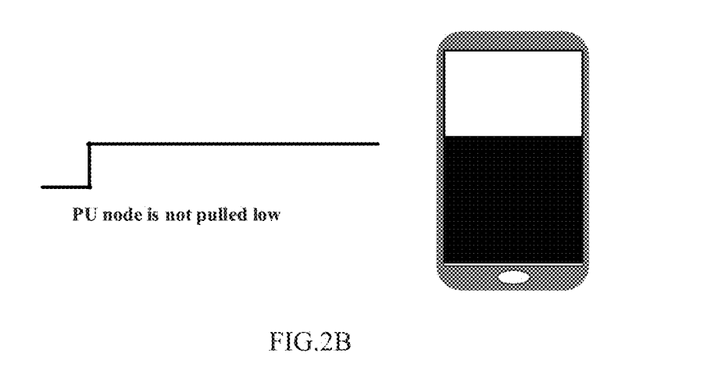
FIG. 2B is a schematic diagram of a pull-up node PU in a gate driving circuit in a case where the potential of the pull-up node PU cannot be normally pulled low.

For example, a plurality of the shift register units as shown in FIG. 1 can be cascaded to form a gate driving circuit, and the gate driving circuit can drive a display panel to display. For example, as shown in FIG. 2A, in a case where the gate driving circuit is used to drive a display panel of a mobile phone to display an image with white top and black bottom, if the pull-up node PU in each stage of the shift register units in the gate driving circuit works normally, that is, a potential of the pull-up node PU is pulled high to realize normal display, and then pulled low to realize a reset of the pull-up node PU, then the mobile phone can normally display the image with white top and black bottom. As shown in FIG. 2B, if the pull-up node PU in the shift register unit corresponding to the last row of sub-pixel units in the display panel cannot be normally reset after being pulled high, then gate electrodes of transistors in the last row of sub-pixel units are continuously in a pulled high state, and then display abnormality may occur in the last row, such as white bright line (white bottom).

Figure 3:
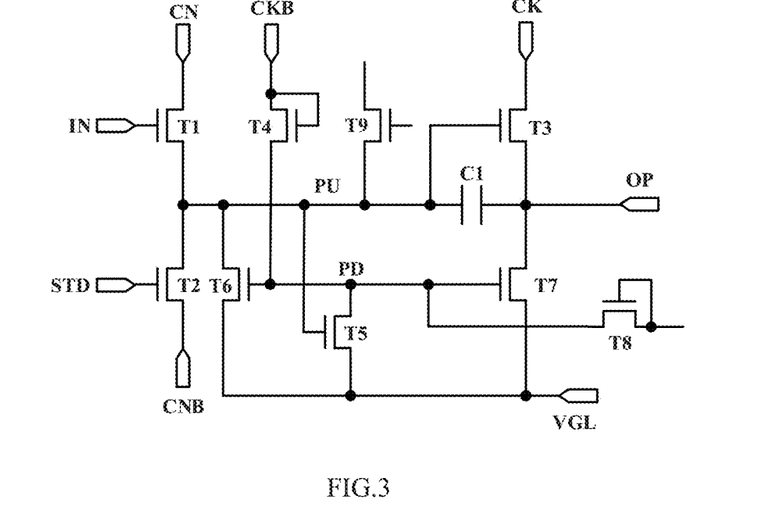
FIG. 3 is a circuit diagram of another shift register unit.

In order to solve the above problem that the pull-up node PU cannot be normally reset, for example, in the shift register unit as shown in FIG. 3, the potential of the pull-up node PU is indirectly controlled by controlling the potential of the pull-down node PD with a eighth transistor T8. For example, when the pull-up node PU needs to be reset, the eighth transistor T8 is turned on, and a high-level signal is input through the eighth transistor T8, thereby pulling up the potential of the pull-down node PD. The high potential of the pull-down node PD can turn on the sixth transistor T6, thereby indirectly resetting the pull-up node PU.

For another example, in the shift register unit as shown in FIG. 3, the pull-up node PU can be directly reset by adding a ninth transistor T9. For example, when the pull-up node PU needs to be reset, the ninth transistor T9 is turned on, so that the pull-up node PU can be discharged through the ninth transistor T9, thereby realizing the reset of the pull-up node PU.

In the shift register unit as shown in FIG. 3, in one aspect, the effect of indirectly resetting the pull-up node PU by controlling the potential of the pull-down node PD is not as good as the effect of directly resetting the pull-up node PU. In another aspect, if a transistor is set to be directly coupled to the pull-up node PU, leakage may occur when the pull-up node PU is at a high level, thus causing insufficient charging of the pull-up node PU and further causing display abnormality.

In view of the above problems, at least one embodiment of the present disclosure provides a shift register unit, and the shift register unit includes an input circuit, an output circuit, a first reset circuit, a second reset circuit and a common reset circuit. The input circuit is configured to control a level of a first node in response to an input signal; the output circuit includes an output terminal and is configured to output an output voltage signal to the output terminal under control of the level of the first node; the common reset circuit includes a reset control terminal and is configured to reset the first node when a reset turn-on signal is input to the reset control terminal; the first reset circuit is configured to provide a reset turn-on signal to the reset control terminal in response to a first reset signal; and the second reset circuit is configured to provide a reset turn-on signal to the reset control terminal in response to a second reset signal.

At least one embodiment of the present disclosure further provides a gate driving circuit, a display device and a driving method corresponding to the above-mentioned shift register unit.

The shift register unit, the gate driving circuit, the display device and the drive method provided by the embodiments of the disclosure can realize normal reset of the first node on the basis of avoiding leakage of the first node, thereby avoiding display abnormality.

It should be noted that, in the embodiments of the present disclosure, for the purpose of explanation, "one frame", "every frame" or "a certain frame" are defined to include a display period and a global reset period that are sequentially performed. For example, in the display period, the gate driving circuit outputs a scan driving signal, which can drive a display panel to complete a scan display of a complete image from a first row to the last row; for example, in the global reset period, the first node in each stage of the shift register units 10 in the gate driving circuit is reset to complete a global reset.

In addition, in the embodiments of the present disclosure, the first node is the pull-up node PU, and the second node is the pull-down node PD. The following embodiments are the same and will not be described again.

Embodiments of the present disclosure and examples thereof will be described in detail below with reference to the accompanying drawings.

Figure 4:
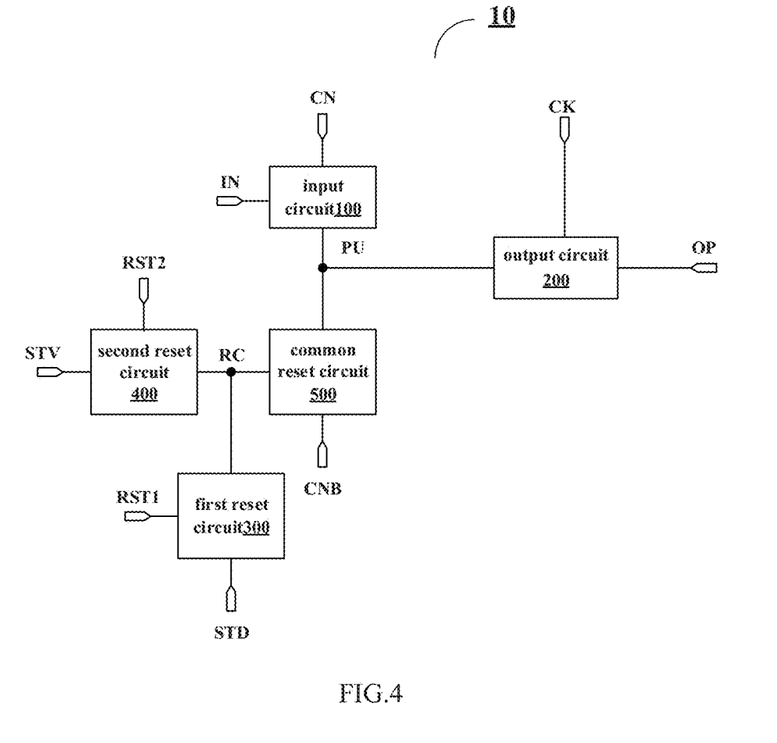
FIG. 4 is a schematic diagram of a shift register unit according to an embodiment of the present disclosure.

At least one embodiment of the present disclosure provides a shift register unit 10. As shown in FIG. 4, the shift register unit 10 includes an input circuit 100, an output circuit 200, a first reset circuit 300, a second reset circuit 400 and a common reset circuit 500.

The input circuit 100 is configured to control a level of a pull-up node PU in response to an input signal, such as charging the pull-up node PU. For example, the input circuit 100 includes an input terminal IN and a first voltage terminal CN. The input terminal IN is configured to receive an input signal, the first voltage terminal CN is configured to receive a first voltage, and the input circuit 100 is coupled to the pull-up node PU. For example, when the first voltage is at a high level, the input circuit 100 can charge the pull-up node PU with the first voltage. For another example, when the first voltage is at a low level, the pull-up node PU can also be discharged through the input circuit 100, thereby realizing a reset of the pull-up node PU. In the embodiments of the present disclosure, the input circuit 100 is not limited to the above-mentioned structure. For example, in other embodiments, the input circuit 100 may charge the pull-up node PU by using the input signal directly.

The output circuit 200 includes an output terminal OP and is configured to output an output voltage signal to the output terminal OP under control of the level of the pull-up node PU. For example, the output circuit 200 further includes a first clock signal terminal CK, the first clock signal terminal CK is configured to receive a first clock signal, and the output circuit 200 is coupled to the pull-up node PU. For example, when the pull-up node PU is at a high level, the output circuit 200 is turned on, so that the first clock signal can be output to the output terminal OP as the output voltage signal. For example, the output voltage signal may be used to drive a row of sub-pixel units of a display panel to display.

The common reset circuit 500 includes a reset control terminal RC and is configured to reset the pull-up node PU when a reset turn-on signal is input to the reset control terminal RC. For example, the common reset circuit 500 includes a second voltage terminal CNB, and the second voltage terminal CNB is configured to receive a second voltage. For example, when the reset control terminal RC inputs the reset turn-on signal, the common reset circuit 500 is turned on. When the second voltage is at a low level, the pull-up node PU can be discharged through the turned-on common reset circuit 500, and thereby realizing the reset of the pull-up node PU. For another example, when the second voltage is at a high level, the turned-on common reset circuit 500 can further charge the pull-up node PU with the second voltage.

As shown in FIG. 4, the common reset circuit 500 is coupled to the pull-up node PU, the first reset circuit 300 and the second reset circuit 400. It should be noted that in the embodiments of the present disclosure, the reset turn-on signal represents a signal that can turn on the common reset circuit 500, and the following embodiments are the same as this and will not be described again.

The first reset circuit 300 is configured to provide the reset turn-on signal to the reset control terminal RC in response to a first reset signal. For example, the first reset circuit 300 includes a first reset signal terminal RST1 and a cascade terminal, the first reset signal terminal RST1 is configured to receive the first reset signal, and the cascade terminal STD is configured to receive the reset turn-on signal.

As shown in FIG. 4, the first reset circuit 300 is coupled to the reset control terminal RC. For example, when the first reset signal is at a high level, the first reset circuit 300 is turned on, so that the reset turn-on signal received by the cascade terminal STD can be provided to the reset control terminal RC.

The second reset circuit 400 is configured to provide the reset turn-on signal to the reset control terminal RC in response to a second reset signal. For example, the second reset circuit 400 includes a second reset signal terminal RST2 and a frame signal terminal STV, the second reset signal terminal RST2 is configured to receive the second reset signal, and the frame signal terminal STV is configured to receive the reset turn-on signal.

As shown in FIG. 4, the second reset circuit 400 is coupled to the reset control terminal RC. For example, when the second reset signal is at a high level, the second reset circuit 400 is turned on, so that the reset turn-on signal received by the frame signal terminal STV can be provided to the reset control terminal RC.

For example, a plurality of shift register units 10 as shown in FIG. 4 can be cascaded to form a gate driving circuit, which can drive a display panel to perform scanning display and provide scanning signals for a plurality of gate lines of the display panel in sequence, so as to perform a progressive scanning or an interlaced scanning during the display panel displaying a frame of image.

For example, when the gate driving circuit drives a display panel to perform a forward scanning, the input terminal IN of each stage of the shift register units 10 is coupled to the output terminal OP of a shift register unit 10 of a preceding stage to receive the input signal, and the cascade terminal STD of each stage of the shift register units 10 is coupled to the output terminal OP of a shift register unit 10 of a next stage to receive the reset turn-on signal. The first voltage received by the first voltage terminal CN of each stage of the shift register units 10 is kept at a high level, and the second voltage received by the second voltage terminal CNB of each stage of the shift register units 10 is kept at a low level. For example, in a display period of one frame, the first reset signal received by the first reset signal terminal RST1 of each stage of the shift register units 10 is kept at a high level, which can keep the first reset circuit 300 to be in a turned-on state, thus electrically connecting the reset control terminal RC and the cascade terminal STD, thereby resetting the pull-up node PU during the progressive scanning. In the display period, the second reset signal received by the second reset signal terminal RST2 of each stage of the shift register units 10 is kept at a low level, which can keep the second reset circuit 400 to be in a turned-off state.

For another example, in a global reset period of the frame, the second reset signal received by the second reset signal terminal RST2 of each stage of the shift register units 10 is kept at a high level, which can keep the second reset circuit 400 to be in a turned-on state, thus making the reset control terminal RC to be electrically coupled to the frame signal terminal STY; at the same time, the frame signal terminal STV of each stage of the shift register units 10 receives a high-level reset turn-on signal, which is applied to the reset control terminal RC, so that the common reset circuit 500 can be turned on to reset the pull-up node PU of each stage of the shift register units 10, that is, to realize a global reset. At the same time, in the global reset period, the first reset signal received by the first reset signal terminal RST1 of each stage of the shift register units 10 is kept at a low level, which can keep the first reset circuit 300 to be in a turned-off state, thus preventing the high-level reset turn-on signal from being transmitted to the output terminal OP of a shift register unit 10 of a next stage through the first reset circuit 300, that is, display abnormality can be avoided.

For example, when the gate driving circuit drives a display panel to perform an backward scanning, the input terminal IN of each stage of the shift register units 10 is coupled to the output terminal OP of a shift register unit 10 of the next stage to reset the pull-up node PU during the progressive scanning. The cascade terminal STD of each stage of the shift register units 10 is coupled to the output terminal OP of a shift register unit 10 of the preceding stage to receive the input signal, and the first voltage received by the first voltage terminal CN of each stage of the shift register units 10 is kept at a low level. For example, in a display period of one frame, the second voltage received by the second voltage terminal CNB of each stage of the shift register units 10 is kept at a high level; the first reset signal received by the first reset signal terminal RST1 of each stage of the shift register units 10 is kept at a high level, which can keep the first reset circuit 300 to be in a turned-on state, thus electrically connecting the reset control terminal RC and the cascade terminal STD, and the input signal can be applied to the reset control terminal RC, so that the common reset circuit 500 is turned on, thus charging the pull-up node PU with the second voltage of a high level, thus completing the progressive scanning; and in the display period, the second reset signal received by the second reset signal terminal RST2 of each stage of the shift register units 10 is kept at a low level, which can keep the second reset circuit 400 to be in a turned-off state.

For another example, in a global reset period of the frame, the second voltage received by the second voltage terminal CNB of each stage of the shift register units 10 is kept at a low level; the second reset signal received by the second reset signal terminal RST2 of each stage of the shift register units 10 is kept at a high level, which can keep the second reset circuit 400 to be in a turned-on state, thus electrically connecting the reset control terminal RC and the frame signal terminal STY; at the same time, the frame signal terminal STV of each stage of the shift register units 10 receives a high-level reset turn-on signal at the global reset period, and the reset turn-on signal is applied to the reset control terminal RC, so that the common reset circuit 500 can be turned on to reset the pull-up node PU of each stage of the shift register units 10, that is, to realize the global reset. At the same time, in the global reset period, the first reset signal received by the first reset signal terminal RST1 of each stage of the shift register units 10 is kept at a low level, which can keep the first reset circuit 300 to be in a turned-off state, thus preventing the high-level reset turn-on signal from being transmitted to the output terminal OP of a shift register unit 10 of the preceding stage through the first reset circuit 300, that is, display abnormality can be avoided.

For another example, when the above-mentioned gate driving circuit drives a display panel to perform the progressive scanning during a display period of one frame, the number of rows driven by the gate driving circuit can be controlled by adjusting the timing of the first reset signal received by the first reset signal terminal RST1, so that it can be used for some special bad analysis, such as detecting whether the display function of certain rows of the display panel is normal.

As described above, by setting the common reset circuit 500, the first reset circuit 300 and the second reset circuit 400, in one aspect, the pull-up node PU can be reset in the display period of one frame; in another aspect, it is also possible to globally reset the pull-up node PU in the global reset period of the frame. In addition, by adjusting the timing of the first reset signal received by the first reset signal terminal RST1, the number of rows driven by the gate driving circuit can also be controlled.

Figure 5:
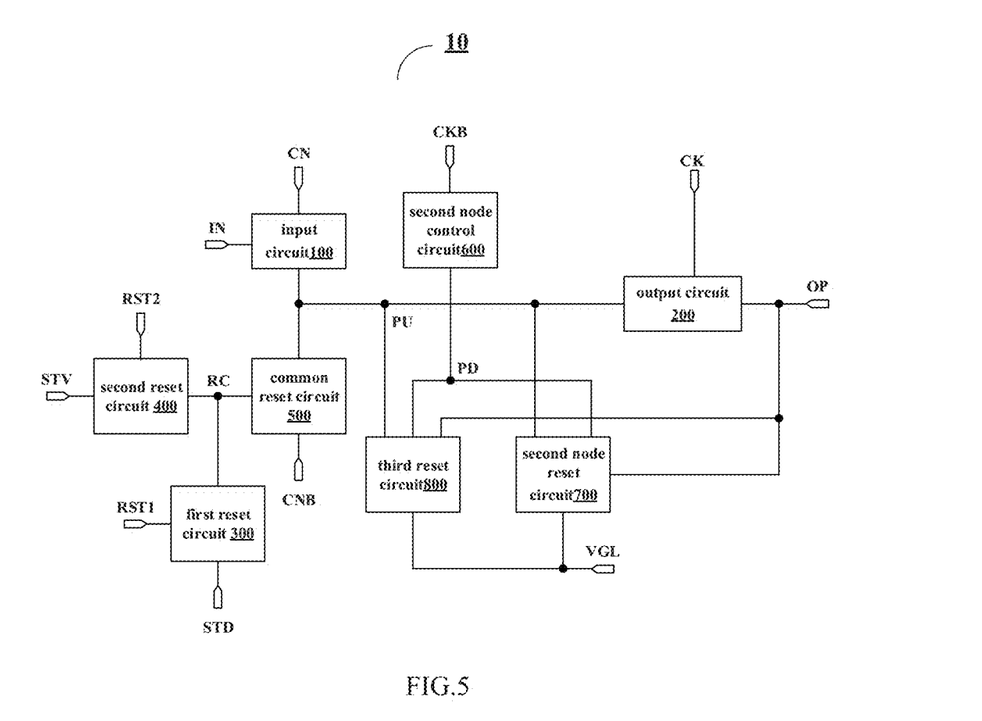
FIG. 5 is a schematic diagram of another shift register unit according to an embodiment of the present disclosure.

For example, as shown in FIG. 5, in another embodiment of the present disclosure, the shift register unit 10 further includes a pull-down node PD, a second node control circuit 600, a second node reset circuit 700 and a third reset circuit 800.

The second node control circuit 600 is configured to control a level of the pull-down node PD in response to a control signal, such as charging the pull-down node PD. For example, the second node control circuit 600 is coupled to a second clock signal terminal CKB and the pull-down node PD, and the second clock signal terminal CKB is configured to receive a second clock signal, which may be used as the control signal. For example, when the second clock signal is at a high level, the second node control circuit 600 can be turned on in response to the second clock signal, so that the pull-down node PD can be charged with the second clock signal at a high level.

It should be noted that in the embodiments of the present disclosure, controlling a level of a node (e.g., pull-up node PU, pull-down node PD, etc.) includes charging the node to pull up the level of the node or discharging the node to pull down the level of the node. Charging a node means, for example, electrically connecting the node with a high-level voltage signal, thereby using the high-level voltage signal to pull up the level of the node; discharging a node means, for example, electrically connecting the node to a low-level voltage signal, thereby using the low-level voltage signal to pull down the level of the node. For example, a capacitor electrically coupled to the node can be set, and charging or discharging the node means charging or discharging the capacitor electrically coupled to the node.

The second node reset circuit 700 is configured to reset the pull-down node PD under control of the level of the pull-up node PU. For example, the second node reset circuit 700 is coupled to the pull-up node PU, the pull-down node PD and a third voltage terminal VGL. For example, when the pull-up node PU is at a high level, the second node reset circuit 700 can be turned on in response to the high level, so that the pull-down node PD and the third voltage terminal VGL are electrically connected, thereby resetting the pull-down node PD. It should be noted that in the embodiments of the present disclosure, the third voltage terminal VGL is configured to receive a third voltage, for example, the third voltage is kept at a DC low level, and the following embodiments are the same as the above and will not be described again.

For another example, the second node reset circuit 700 can further be coupled to the output terminal OP. For example, when the output terminal OP outputs a high-level signal, the high-level signal can control the second node reset circuit 700 to be turned on, thereby resetting the pull-down node PD. When the output terminal OP outputs a high level signal, the pull-down node PD is reset by the second node reset circuit 700, which can reduce the noise of the pull-down node PD, thereby reducing the influence of the pull-down node PD on the output terminal OP.

The third reset circuit 800 is configured to reset the pull-up node PU and the output terminal OP under control of the level of the pull-down node PD. For example, the third reset circuit 800 is coupled to the pull-up node PU, the pull-down node PD, the output terminal OP and the third voltage terminal VGL. For example, when the pull-down node PD is at a high level, the third reset circuit 800 can be turned on in response to the high level, so that both the pull-up node PU and the output terminal OP are electrically coupled to the third voltage terminal VGL, and thereby resetting the pull-up node PU and the output terminal OP.

Figure 6:
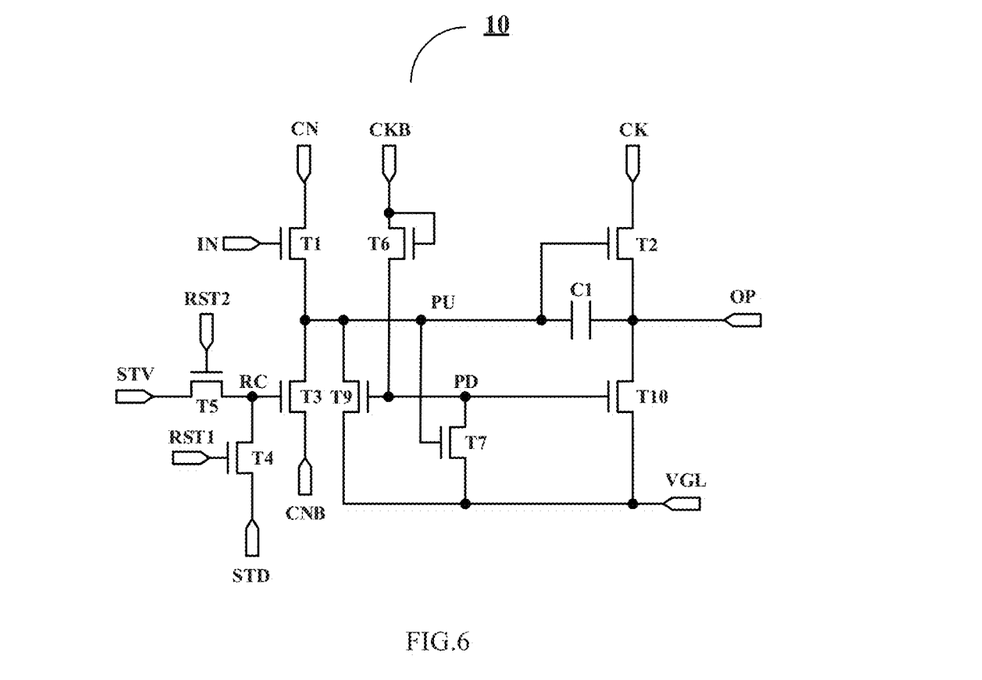
FIG. 6 is a circuit diagram of a shift register unit according to an embodiment of the present disclosure.
Figure 7:
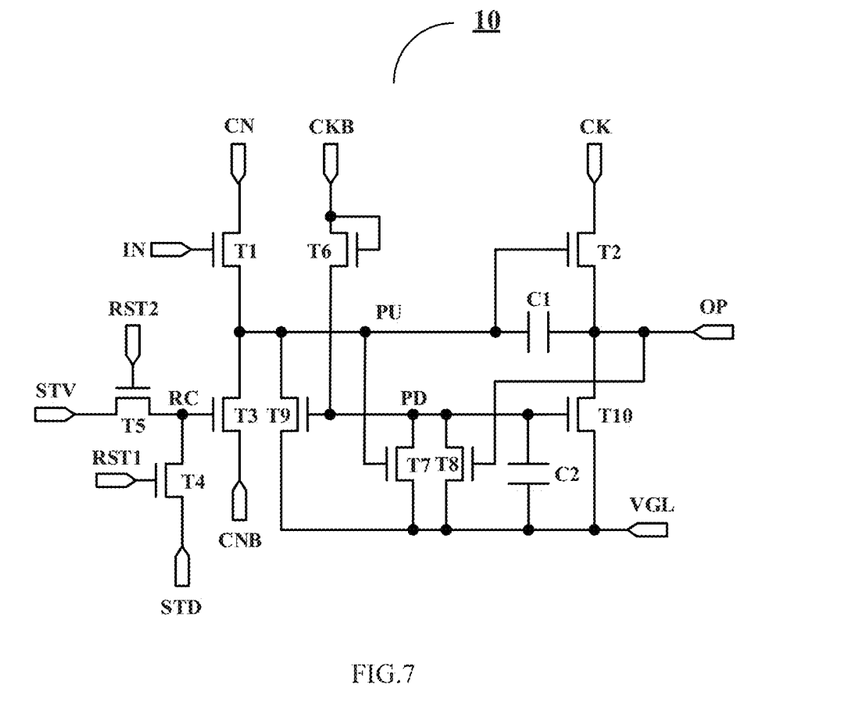
FIG. 7 is a circuit diagram of another shift register unit according to an embodiment of the present disclosure.

For example, the shift register unit 10 as shown in FIG. 5 can be implemented as the circuit structures as shown in FIG. 6 and FIG. 7.

As shown in FIG. 6 and FIG. 7, the input circuit 100 can be implemented as a first transistor T1. A gate electrode of the first transistor T1 is coupled to the input terminal IN to receive the input signal, a first electrode of the first transistor T1 is coupled to the first voltage terminal CN, and a second electrode of the first transistor T1 is coupled to the pull-up node PU.

For example, in a case where a plurality of shift register units 10 are cascaded to form a gate driving circuit, an input terminal IN of the present stage shift register unit 10 can be coupled to an output terminal OP of a shift register unit 10 of an adjacent stage.

As shown in FIG. 6 and FIG. 7, the output circuit 200 can be implemented to include a second transistor T2 and a first capacitor C1. A gate electrode of the second transistor T2 is coupled to the pull-up node PU, a first electrode of the second transistor T2 is coupled to the first clock signal terminal CK to receive the first clock signal, and a second electrode of the second transistor T2 is coupled to the output terminal OP. A first electrode of the first capacitor C1 is coupled to the pull-up node PU, and a second electrode of the first capacitor C1 is coupled to the output terminal OP.

As shown in FIG. 6 and FIG. 7, the common reset circuit 500 can be implemented to include a third transistor T3 and a second voltage terminal CNB, and the second voltage terminal CNB is configured to receive a second voltage. A gate electrode of the third transistor T3 is coupled to the reset control terminal RC, a first electrode of the third transistor T3 is coupled to the pull-up node PU, and a second electrode of the third transistor T3 is coupled to the second voltage terminal CNB to receive the second voltage.

As shown in FIG. 6 and FIG. 7, the first reset circuit 300 can be implemented as a fourth transistor T4. A gate electrode of the fourth transistor T4 is coupled to the first reset signal terminal RST1 to receive the first reset signal, a first electrode of the fourth transistor T4 is coupled to the reset control terminal RC, and a second electrode of the fourth transistor T4 is coupled to the cascade terminal STD.

For example, in a case where a plurality of shift register units 10 are cascaded to form a gate driving circuit, the cascade terminal STD of the present stage shift register unit 10 can be coupled to the output terminal OP of a shift register unit 10 of an adjacent stage.

As shown in FIG. 6 and FIG. 7, the second reset circuit 400 can be implemented as a fifth transistor T5. A gate electrode of the fifth transistor T5 is coupled to the second reset signal terminal RST2 to receive the second reset signal, a first electrode of the fifth transistor T5 is coupled to the frame signal terminal STV to receive the reset turn-on signal, and a second electrode of the fifth transistor T5 is coupled to the reset control terminal RC.

As shown in FIG. 6, in one embodiment, the second node control circuit 600 can be implemented as a sixth transistor T6. A gate electrode and a first electrode of the sixth transistor T6 are coupled to the second clock signal terminal CKB to receive the second clock signal, and a second electrode of the sixth transistor T6 is coupled to the pull-down node PD.

As shown in FIG. 7, in another embodiment, the second node control circuit 600 can further include a second capacitor C2. A first electrode of the second capacitor C2 is coupled to the pull-down node PD, and a second electrode of the second capacitor C2 is coupled to the third voltage terminal VGL. When charging the pull-down node PD, the second capacitor C2 can better maintain the high level of the pull-down node PD. It should be noted that the second electrode of the second capacitor C2 is not limited to being coupled to the third voltage terminal VGL, but can be coupled to other signal terminals or signal lines having a fixed potential, for example, and the embodiments of the present disclosure is not limited to this.

As shown in FIG. 6, in one embodiment, the second node reset circuit 700 can be implemented as a seventh transistor T7. A gate electrode of the seventh transistor T7 is coupled to the pull-up node PU, a first electrode of the seventh transistor T7 is coupled to the pull-down node PD, and a second electrode of the seventh transistor T7 is coupled to the third voltage terminal VGL.

As shown in FIG. 7, in another embodiment, the second node reset circuit 700 can further include an eighth transistor T8. A gate electrode of the eighth transistor T8 is coupled to the output terminal OP, a first electrode of the eighth transistor T8 is coupled to the pull-down node PD, and a second electrode of the eighth transistor T8 is coupled to the third voltage terminal VGL.

As shown in FIG. 6 and FIG. 7, the third reset circuit 800 can be implemented to include a ninth transistor T9 and a tenth transistor T10. A gate electrode of the ninth transistor T9 is coupled to the pull-down node PD, a first electrode of the ninth transistor T9 is coupled to the pull-up node PU, and a second electrode of the ninth transistor T9 is coupled to the third voltage terminal VGL. A gate electrode of the tenth transistor T10 is coupled to the pull-down node PD, a first electrode of the tenth transistor T10 is coupled to the output terminal OP, and a second electrode of the tenth transistor T10 is coupled to the third voltage terminal VGL.

It should be noted that the transistors in the embodiments of the present disclosure can adopt thin film transistors, field-effect transistors or other switching devices with the same characteristics. In the embodiments of the present disclosure, thin film transistors are adopted as an example for description. Source electrodes and drain electrodes of the transistors adopted herein can be symmetrical in structure, so the source electrodes and drain electrodes cannot be different structurally. In the embodiment of the present disclosure, in order to distinguish between two electrodes of a transistor other than a gate electrode, it is directly described that one of the two electrodes is a first electrode and the other electrode is a second electrode.

In addition, the transistors in the embodiments of the present disclosure are all described by taking an N-type transistor as an example. In this case, the first electrode can be a drain electrode and the second electrode can be a source electrode. It should be noted that, the embodiments of the present disclosure include, but are not limited to, the examples. For example, one or more switches in the pixel circuit provided in the embodiments of the present disclosure can also adopt P-type thin film transistors. In this case, the first electrode can be a source electrode and the second electrode can be a drain electrode. For a different type of transistor, each electrode of this transistors need to be correspondingly coupled to reference to each electrode of the corresponding transistor employed in examples of the embodiments of the present disclosure. In addition, the specific meanings of the terms "pull-up" and "pull-down" will also be adjusted according to the specific type of transistor used, as long as the control of the transistor can be realized to realize the corresponding switching function.

It should be noted that, in the embodiments of the present disclosure, the high level and the low level are described relatively. The high level represents a relatively higher voltage range (for example, the high level can adopt 5V, 10V, or other appropriate voltage), and multiple high levels can be same or different. Similarly, the low level indicates a lower voltage range (for example, the low level can adopt 0V, −5V, −10V, or other appropriate voltage), and multiple low levels can be same or different. For example, the minimum value of the high level is greater than the maximum value of the low level.

Figure 8:
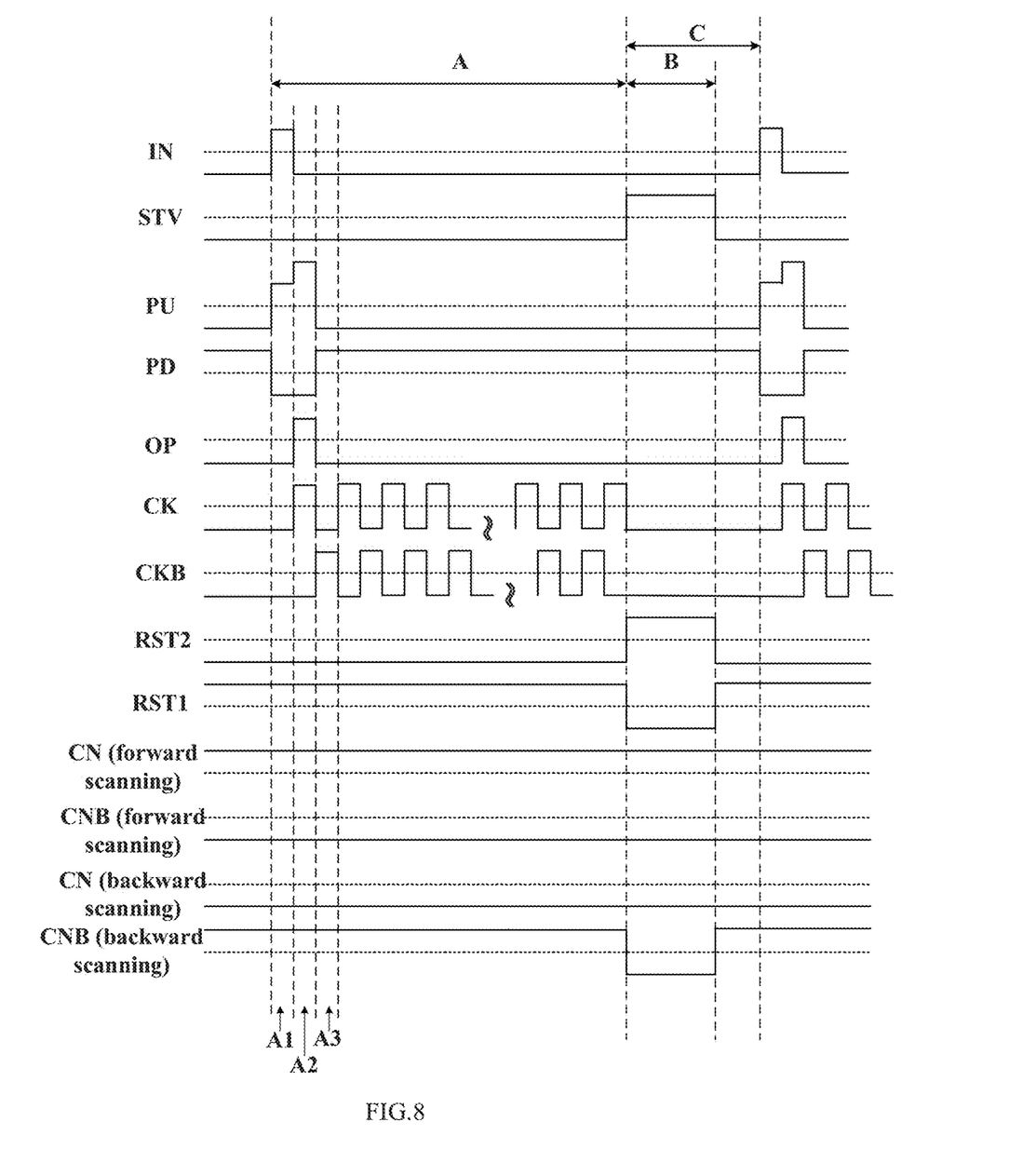
FIG. 8 is a signal timing diagram corresponding to an operation process of the shift register unit as shown in FIG. 7.

For example, as shown in FIG. 7, the transistors of the shift register unit 10 are all n-type transistors, the operation principle of the shift register unit 10 as shown in FIG. 7 will be described below with reference to the signal timing diagram as shown in FIG. 8, and the following will first take the forward scanning as an example.

As shown in FIG. 8, one frame includes a display period A and a blanking period C between two frames. For example, the blanking period C includes a global reset period B. It should be noted that the global reset period B is not limited to the timing as shown in FIG. 8, for example, the global reset period B can also be shifted to the right in timing without being continuous with the display period A. For example, the display period A includes an input period A1, an output period A2 and a reset period A3. In the above periods, the shift register unit 10 performs the following operations.

In the input period A1, the input terminal IN inputs a high-level signal, the first transistor T1 is turned on, and the high-level first voltage received by the first voltage terminal CN can control the level of the pull-up node PU, such as charging the pull-up node PU, so that the potential of the pull-up node PU is pulled high. Because the pull-up node PU is at a high level, the second transistor T2 is turned on, and the first clock signal received by the first clock signal terminal CK is at a low level at this time, the output terminal OP outputs a low-level signal at the input period A1.

Because the second clock signal received by the second clock signal terminal CKB is at a low level, the sixth transistor T6 is turned off, and the pull-down node PD has no charging path. In addition, because the pull-up node PU is at a high level, the seventh transistor T7 is turned on, and the pull-down node PD is discharged to a low level through the seventh transistor T7, thereby causing the potential of the pull-down node PD not affect the charging process of the pull-up node PU, and causing the charging of the pull-up node PU to be more sufficient.

In the output period A2, the first clock signal received by the first clock signal terminal CK changes to a high level. Due to the storage effect of the first capacitor C1, the pull-up node PU maintains the high level of the previous period, so that the second transistor T2 remains in a turned-on state. Therefore, the output terminal OP outputs the high-level first clock signal as the output voltage signal in the output period A2.

The output terminal OP is at a high level. Due to the bootstrap effect of the first capacitor C1, the potential of the pull-up node PU is further pulled up to a higher potential. At the same time, because the output terminal OP is at a high level, the eighth transistor T8 is turned on, the pull-down node PD can be further pulled down to further eliminate the noise of the pull-down node PD, thereby causing the pull-down node PD not affect the normal output of the output terminal OP.

In the reset period A3, the output terminal OP of the shift register unit 10 of a next stage outputs a high-level signal, and because the cascade terminal STD is coupled to the output terminal OP of the shift register unit 10 of the next stage, the cascade terminal STD receives the high-level signal in the reset period A3. Meanwhile, the first reset signal received by the first reset signal terminal RST1 is at a high level, the fourth transistor T4 is turned on, the high-level signal received by the cascade terminal STD is provided to the reset control terminal RC, and the third transistor T3 is turned on. Because the second voltage terminal CNB receives a low-level second voltage in the reset period A3, the pull-up node PU can be discharged to a low level through the third transistor T3, thereby completing the reset of the pull-up node PU.

Because the pull-up node PU is at a low level, the seventh transistor T7 is turned off. At the same time, because the second clock signal terminal CKB receives a high-level second clock signal in this period, the sixth transistor T6 is turned on, and the high-level second clock signal can control the level of the pull-down node PD, such as charging the pull-down node PD, to pull up the pull-down node PD to a high level. Because the pull-down node PD is at a high level, the ninth transistor T9 and the tenth transistor T10 are turned on, the turned-on ninth transistor T9 can further pull-down the pull-up node PU to reduce noise at the pull-down PD, and the turned-on tenth transistor T10 can reset the output terminal OP.

In the global reset period B, the second reset signal received by the second reset signal terminal RST2 is at a high level, the fifth transistor T5 is turned on, and the high-level signal (reset turn-on signal) received by the frame signal terminal STV can be provided to the reset control terminal RC, so that the third transistor T3 is turned on, thereby completing the reset of the pull-up node PU. Because the frame signal terminal STV and the second reset signal terminal RST2 of each stage of the shift register units 10 receive a same signal, the pull-up node PU in each stage of the shift register units 10 can be reset in the global reset period B, that is, a global reset can be realized.

Meanwhile, in the global reset period B, the first reset signal received by the first reset signal terminal RST1 is at a low level, the fourth transistor T4 is kept in a turn-off state, the fourth transistor T4 disconnects the connection between the reset control terminal RC and the cascade terminal STD, so that the high-level signal received by the frame signal terminal STV does not affect the output terminal OP of the shift register unit 10 of the next stage, thereby avoiding abnormal display problems.

The operation principle of the shift register unit 10 as shown in FIG. 7 during the backward scanning will be described below. In backward scanning, the cascade terminal STD is coupled to the output terminal OP of the shift register unit 10 of the preceding stage to receive the input signal, and the input terminal IN is coupled to the output terminal OP of the shift register unit 10 of the next stage.

In the input period A1, the first reset signal terminal RST1 receives a high-level first reset signal and the fourth transistor T4 is turned on. Because the cascade terminal STD receives the high-level signal output from the output terminal OP of the shift register unit 10 of the preceding stage in the input period A1, the high-level signal can be provided to the reset control terminal RC, and the third transistor T3 is turned on, so that the high-level second voltage received by the second voltage terminal CNB controls the level of the pull-up node PU, such as charging the pull-up node PU.

In the reset period A3, because the input terminal IN is coupled to the output terminal OP of the shift register unit 10 of the next stage, the input terminal IN receives the high-level signal in the reset period A3, the first transistor T1 is turned on, and the first voltage terminal CN receives a low-level first voltage, so that the pull-up node PU is discharged through the first transistor T1 to complete reset.

In the output period A2 and the global reset period B, the operation principle of the shift register unit 10 is the same as that of the forward scanning described above, and will not be described here again.

For example, as shown in FIG. 8, the first reset signal received by the first reset signal terminal RST1 and the second reset signal received by the second reset signal terminal RST2 are mutually inverted phase signals, that is, the second reset signal is at a low level when the first reset signal is at a high level, and the second reset signal is at a high level when the first reset signal is at a low level.

The shift register unit 10 provided by the embodiment of the present disclosure can complete the reset of the pull-up node PU in the display period of one frame, regardless of whether the shift register unit 10 works in the forward scanning or the backward scanning. At the same time, the pull-up node PU can further be globally reset in the global reset period of the frame. In addition, for example, during the backward scanning, the number of rows driven by the gate driving circuit can be controlled by adjusting the timing of the first reset signal received by the first reset signal terminal RST1. For example, in a case where only the first row to the hundredth row need to be driven for display, when the hundredth row completes scanning display, the first reset signal can be controlled to change from a high level to a low level, thereby turning off the fourth transistor T4.

Figure 9:
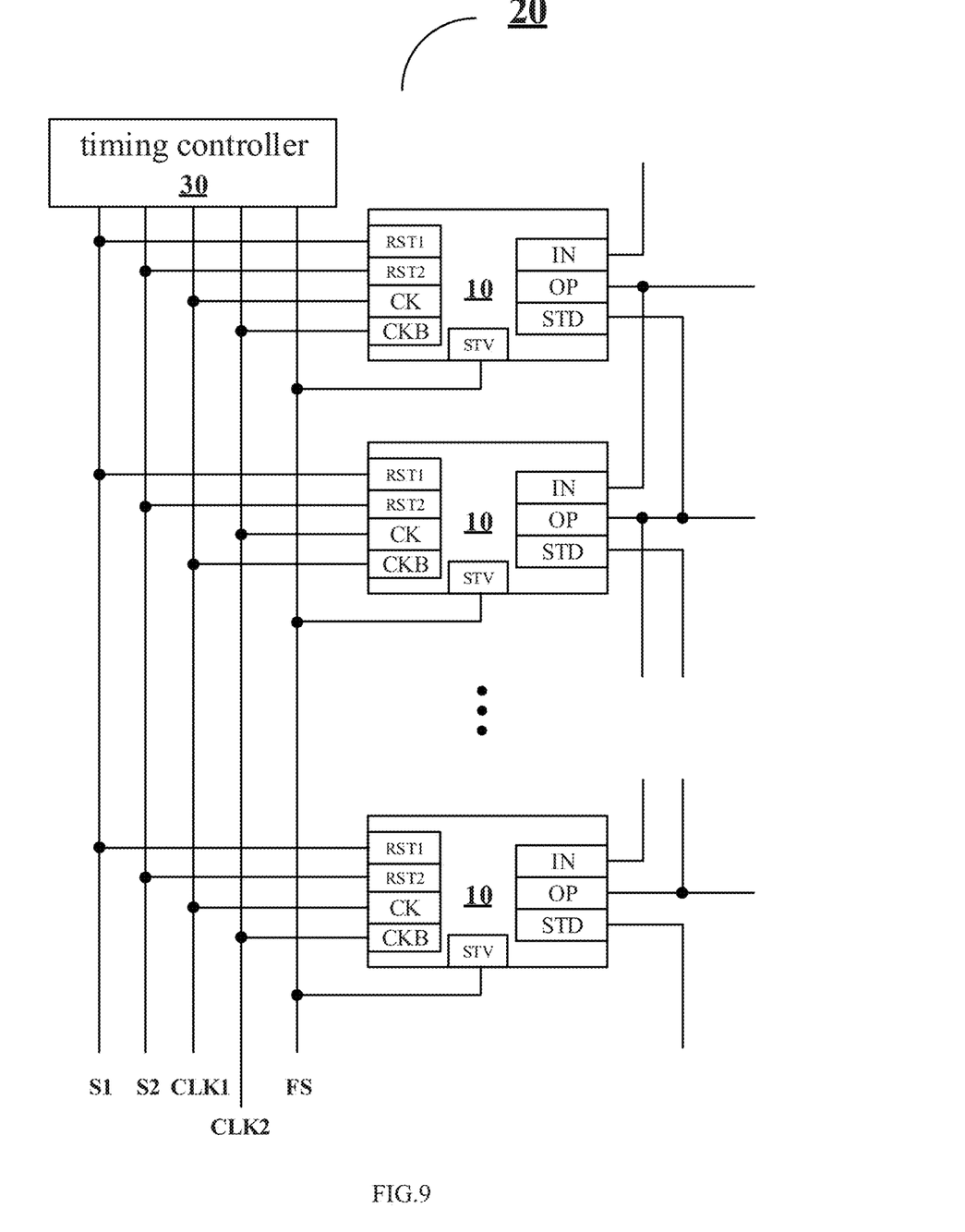
FIG. 9 is a schematic diagram of a gate driving circuit according to an embodiment of the present disclosure.

At least one embodiment of the present disclosure further provides a gate driving circuit 20, as shown in FIG. 9, the gate driving circuit 20 includes a plurality of cascaded shift register units 10, for example, the shift register unit 10 can adopt the shift register unit 10 provided in the above embodiment. The gate driving circuit 20 can be directly integrated onto an array substrate of a display device by adopting the processes similar to those for forming a thin film transistor, and can realize the function of progressive scanning drive.

For example, as shown in FIG. 9, the gate driving circuit 20 includes a first scanning signal line S1, a second scanning signal line S2 and a frame signal line FS.

Each stage of the shift register units 10 is coupled to the first scanning signal line S1 to receive the first reset signal, for example, each stage of the shift register units 10 is coupled to the first scanning signal line S1 through the first reset signal terminal RST1; each stage of the shift register units 10 is coupled to the second scanning signal line S2 to receive the second reset signal, for example, each stage of the shift register units 10 is coupled to the second scanning signal line S2 through the second reset signal terminal RST2; except a first-stage of the shift register units 10, all other stages of the shift register units 10 are all coupled to the frame signal line FS to receive the reset turn-on signal, for example, the shift register unit 10 is coupled to the frame signal line FS through the frame signal terminal STY; the first-stage of the shift register units 10 is coupled to the frame signal line FS to receive the input signal and the reset turn-on signal. For example, the input terminal IN and the frame signal terminal STV of the first-stage of the shift register units 10 are both coupled to the frame signal line FS.

As shown in FIG. 9, the gate driving circuit 20 further includes a first clock signal line CLK1 and a second clock signal line CLK2. For example, the first clock signal line CLK1 can be configured to be coupled to the first clock signal terminal CK of the odd-stage shift register unit 10, and the first clock signal line CLK1 can further be configured to be coupled to the second clock signal terminal CKB of the even-stage shift register unit 10; for example, the second clock signal line CLK2 can be configured to be coupled to the second clock signal terminal CKB of the odd-stage shift register unit 10, and the second clock signal line CLK2 can also be configured to be coupled to the first clock signal terminal CK of the even-stage shift register unit 10.

Figure 10:
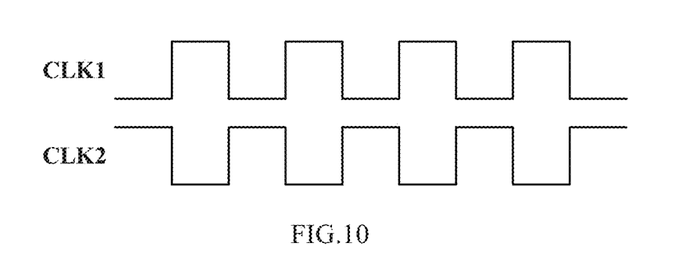
FIG. 10 is a signal timing diagram of a first clock signal line and a second clock signal line.

For example, the timing of the clock signal provided on the first clock signal line CLK1 and the second clock signal line CLK2 can adopt the signal timing as shown in FIG. 10, which are mutually inverted phase signals.

For example, as shown in FIG. 9, except the first-stage of the shift register units, the input circuit of any one of the shift register units of other stages is coupled to the output circuit of the shift register unit of the preceding stage before the any one of the shift register units of other stages, that is, the input terminal of each shift register unit is coupled to the output terminal OP of the shift register unit of the preceding stage.

Except the last-stage of the shift register units, the first reset circuit of any one of the shift register units of other stages is coupled to the output circuit of the shift register unit of the next stage after the any one of the shift register units of other stages, that is, the cascade terminal STD of each stage of the shift register units is coupled to the output terminal OP of the shift register unit of the next stage.

For example, as shown in FIG. 9, the gate driving circuit 20 can further include a timing controller 30. The timing controller 30 is coupled to the above signal lines (S1, S2, FS, CLK1, and CLK2) to provide corresponding timing signal.

The technical effect of the gate driving circuit 20 provided by the embodiment of the present disclosure can be described with reference to the corresponding description of the shift register unit 10 in the above embodiment, which is not repeated here.

Figure 11:
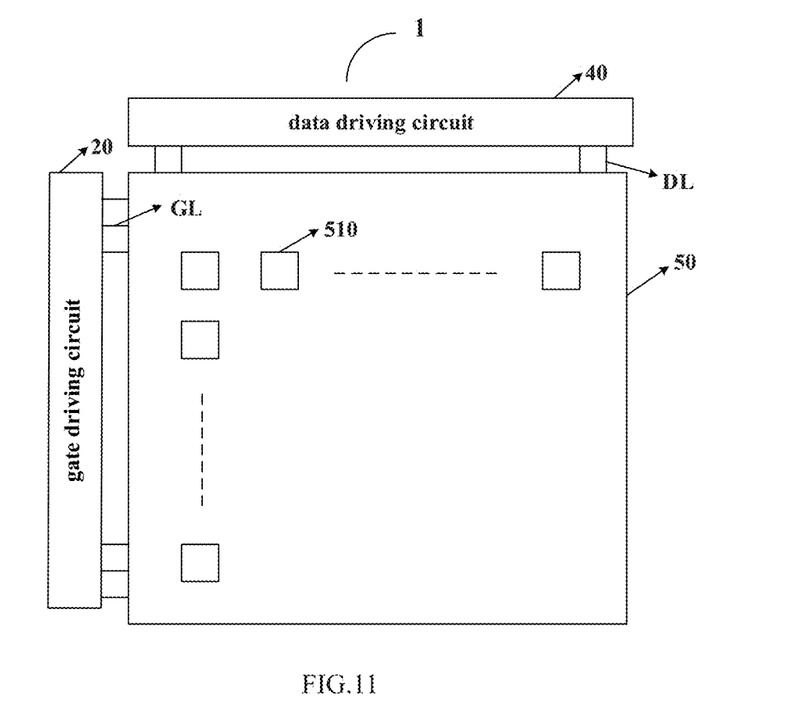
FIG. 11 is a schematic diagram of a display device according to an embodiment of the present disclosure.

The embodiment of the present disclosure further provides a display device 1. As shown in FIG. 11, the display device 1 includes a gate driving circuit 20 provided by the embodiment of the present disclosure and a plurality of sub-pixel units 510 arranged in an array. For example, the display device 1 further includes a display panel 50 in which a pixel array composed of the plurality of sub-pixel units 510 is disposed.

The output terminal OP of each stage of the shift register units 10 of the gate driving circuit 20 is electrically coupled to the sub-pixel units 510 of different rows, respectively. For example, the gate driving circuit 20 is electrically coupled to the sub-pixel units 510 through the gate line GL. The gate driving circuit 20 is used to provide a driving signal to the pixel array, for example, the driving signal can drive a scanning transistor in the sub-pixel unit 510.

For example, the display device 1 can further include a data driving circuit 40 for providing data signals to the pixel array. For example, the data driving circuit 40 is electrically coupled to the sub-pixel unit 510 through the data line DL.

It should be noted that the display device 1 in this embodiment can be any product or component with a display function such as a liquid crystal panel, a liquid crystal television, a display, an OLED panel, an OLED TV, an electronic paper, a mobile phone, a tablet computer, a notebook computer, a digital photo frame, a navigator, etc. The display device 1 can further include other conventional components such as a display panel, and the embodiments of the present disclosure are not limited thereto.

The technical effect of the display device 1 provided by the embodiment of the present disclosure can be described with reference to the corresponding description of the shift register unit 10 in the above embodiment, which is not repeated here.

At least one embodiment of the present disclosure further provides a driving method which can be used to drive any one of the shift register unit 10 provided in the embodiments of the present disclosure, and the driving method includes a display period and a global reset period for one frame.

In the display period, causing the input circuit 100 to control the level of the pull-up node PU in response to the input signal, such as charging the pull-up node PU, causing the output circuit 200 to output the output voltage signal to the output terminal OP under control of the level of the pull-up node PU, causing the first reset circuit 300 to provide the reset turn-on signal to the reset control terminal RC in response to the first reset signal, and causing the common reset circuit 500 to reset the pull-up node PU.

In the global reset period, causing the second reset circuit 400 to provide the reset turn-on signal to the reset control terminal RC in response to the second reset signal, and causing the common reset circuit 500 to reset the pull-up node PU.

It should be noted that the detailed description and technical effect of the driving method can refer to the description of the working principle of the shift register unit 10 in the embodiment of the present disclosure, which is not repeated here.

What have been described above are only specific implementations of the present disclosure, the protection scope of the present disclosure is not limited thereto. The protection scope of the present disclosure should be based on the protection scope of the claims.

What is claimed is:

1. A shift register unit, comprising an input circuit, an output circuit, a first reset circuit, a second reset circuit, a common reset circuit, a second node control circuit, a second node reset circuit and a third reset circuit,
    wherein the input circuit is configured to control a level of a first node in response to an input signal;
    the output circuit comprises an output terminal and is configured to output an output voltage signal to the output terminal under control of the level of the first node;
    the common reset circuit comprises a reset control terminal and is configured to reset the first node when a reset turn-on signal is input to the reset control terminal;
    the first reset circuit is configured to provide the reset turn-on signal to the reset control terminal in response to a first reset signal;
    the second reset circuit is configured to provide the reset turn-on signal to the reset control terminal in response to a second reset signal;
    the input circuit is respectively coupled to the output circuit and the common reset circuit, the output circuit is coupled to the common reset circuit, the common reset circuit is respectively coupled to the first reset circuit and the second reset circuit, and the first reset circuit is coupled to the second reset circuit;
    the second node control circuit is configured to control a level of a second node in response to a control signal;
    the second node reset circuit is configured to reset the second node under control of the level of the first node;
    the third reset circuit is configured to reset the first node and the output terminal under control of the level of the second node,
    wherein the second node control circuit comprises a sixth transistor; and
    a gate electrode and a first electrode of the sixth transistor are configured to be coupled to a second clock signal terminal to receive a second clock signal, and a second electrode of the sixth transistor is coupled to the second node.

2. The shift register unit according to claim 1, wherein the second node control circuit further comprises a second capacitor;
   a first electrode of the second capacitor is coupled to the second node, and a second electrode of the second capacitor is configured to be coupled to a third voltage terminal to receive a third voltage.

3. The shift register unit according to claim 1, wherein the second node reset circuit comprises a seventh transistor;
   a gate electrode of the seventh transistor is coupled to the first node, a first electrode of the seventh transistor is coupled to the second node, and a second electrode of the seventh transistor is configured to be coupled to a third voltage terminal to receive a third voltage.

4. The shift register unit according to claim 3, wherein the second node reset circuit further comprises an eighth transistor;
   a gate electrode of the eighth transistor is coupled to the output terminal, a first electrode of the eighth transistor is coupled to the second node, and a second electrode of the eighth transistor is configured to be coupled to the third voltage terminal to receive the third voltage.

5. The shift register unit according to claim 1, wherein the first node is a pull-up node and the second node is a pull-down node.

6. A gate driving circuit, comprising a plurality of cascaded shift register units each of which is according to claim 1.

7. The gate driving circuit according to claim 6, further comprising a first scanning signal line, a second scanning signal line and a frame signal line,
   wherein each stage of the shift register units is coupled to the first scanning signal line to receive the first reset signal;
   each stage of the shift register units is coupled to the second scanning signal line to receive the second reset signal;
   except a first-stage of the shift register units, all other stages of the shift register units are coupled to the frame signal line to receive the reset turn-on signal; and
   the first-stage of the shift register units is coupled to the frame signal line to receive the input signal and the reset turn-on signal.

8. The gate driving circuit according to claim 6,
   wherein except a last-stage of the shift register units, the first reset circuit of any one of the shift register units of other stages is coupled to the output circuit of a shift register unit of a next stage after the any one of the shift register units of other stages;
   except a first-stage of the shift register units, the input circuit of any one of the shift register units of other stages is coupled to the output circuit of a shift register unit of a preceding stage before the any one of the shift register units of other stages.

9. A display device, comprising the gate driving circuit according to claim 6.

10. A driving method of the shift register unit according to claim 1, comprising a display period and a global reset period for one frame,
    in the display period, causing the input circuit to control the level of the first node in response to the input signal, causing the output circuit to output the output voltage signal to the output terminal under control of the level of the first node, causing the first reset circuit to provide the reset turn-on signal to the reset control terminal in response to the first reset signal, and causing the common reset circuit to reset the first node; and
    in the global reset period, causing the second reset circuit to provide the reset turn-on signal to the reset control terminal in response to the second reset signal, and causing the common reset circuit to reset the first node.

11. The driving method according to claim 10, wherein the first reset signal and the second reset signal are inverted phase signals to each other.

12. The shift register unit according to claim 1, wherein the input circuit comprises an input terminal and a first voltage terminal, the input terminal is configured to receive the input signal, the first voltage terminal is configured to receive a first voltage, the input circuit is coupled to the first node, and the input circuit controls the level of the first node by using the first voltage when the input circuit is turned on;
    the output circuit further comprises a first clock signal terminal, the first clock signal terminal is configured to receive a first clock signal, the output circuit is coupled to the first node, and the output circuit outputs the first clock signal as the output voltage signal to the output terminal when the output circuit is turned on.

13. The shift register unit according to claim 1, wherein the common reset circuit is coupled to the first node, the first reset circuit and the second reset circuit;
    the first reset circuit comprises a first reset signal terminal and a cascade terminal, the first reset signal terminal is configured to receive the first reset signal, the cascade terminal is configured to receive the reset turn-on signal, the first reset circuit is coupled to the reset control terminal, and the first reset circuit provides the reset turn-on signal to the reset control terminal when the first reset circuit is turned on;
    the second reset circuit comprises a second reset signal terminal and a frame signal terminal, the second reset signal terminal is configured to receive the second reset signal, the frame signal terminal is configured to receive the reset turn-on signal, the second reset circuit is coupled to the reset control terminal, and the second reset circuit provides the reset turn-on signal to the reset control terminal when the second reset circuit is turned on.

14. The shift register unit according to claim 12, wherein the input circuit comprises a first transistor;
    a gate electrode of the first transistor is coupled to the input terminal, a first electrode of the first transistor is coupled to the first voltage terminal, and a second electrode of the first transistor is coupled to the first node.

15. The shift register unit according to claim 12, wherein the output circuit comprises a second transistor and a first capacitor;
    a gate electrode of the second transistor is coupled to the first node, a first electrode of the second transistor is coupled to the first clock signal terminal, and a second electrode of the second transistor is coupled to the output terminal; and
    a first electrode of the first capacitor is coupled to the first node, and a second electrode of the first capacitor is coupled to the output terminal.

16. The shift register unit according to claim 13, wherein the common reset circuit comprises a third transistor and a second voltage terminal;
    the second voltage terminal is configured to receive a second voltage;
    a gate electrode of the third transistor is coupled to the reset control terminal, a first electrode of the third transistor is coupled to the first node, and a second electrode of the third transistor is coupled to the second voltage terminal.

17. The shift register unit according to claim 13, wherein the first reset circuit comprises a fourth transistor;
a gate electrode of the fourth transistor is coupled to the first reset signal terminal, a first electrode of the fourth transistor is coupled to the reset control terminal, and a second electrode of the fourth transistor is coupled to the cascade terminal.

18. The shift register unit according to claim 13, wherein the second reset circuit comprises a fifth transistor;
a gate electrode of the fifth transistor is coupled to the second reset signal terminal, a first electrode of the fifth transistor is coupled to the frame signal terminal, and a second electrode of the fifth transistor is coupled to the reset control terminal.

\* \* \* \* \*